United States Patent [19]
Tew

[11] Patent Number: 4,659,928
[45] Date of Patent: Apr. 21, 1987

[54] FOCAL PLANE ARRAY INFRARED DEVICE

[75] Inventor: Claude E. Tew, Dallas, Tex.

[73] Assignee: Texas Instruments Incorporated, Dallas, Tex.

[21] Appl. No.: 725,967

[22] Filed: Apr. 22, 1985

[51] Int. Cl.[4] .................. G01J 5/04; H01L 31/00
[52] U.S. Cl. ................... 250/332; 250/330; 250/338; 250/370; 330/9
[58] Field of Search .......... 250/332, 330, 338 SE, 250/370 G, 370 K, 370 R, 370 L, 334; 330/7, 9; 357/32

[56] References Cited

U.S. PATENT DOCUMENTS 4,360,732 11/1982 Chapman et al. ............ 250/332
4,403,148 9/1983 Coon et al. .................. 250/332

OTHER PUBLICATIONS

D. J. Carlson, A. D. Markum, G. L. Payton and R. S. Spriggs, "Development of a Staring Mosaic Module" *Modern Utilization of Infrared Technology* V vol. 197, Proceedings of the Society of Photo-Optical Instrument Engineers Conference (USA, 1979) pp. 2–8.
M. A. Copeland and J. M. Rabaey, "Dynamic Amplifier for M.O.S. Technology" IEEE *Electronics Letters* vol. 15, No. 10 (10 May 1979) pp. 301–302.

*Primary Examiner*—Janice A. Howell
*Assistant Examiner*—Constantine Hannaher
*Attorney, Agent, or Firm*—Richard K. Robinson; Leo N. Heiting; Melvin Sharp

[57] ABSTRACT

A focal plane array infrared device includes an optical system for focusing incoming infrared energy, a scanner for scanning the focused infrared energy onto a focal plane detector array for converting the infrared energy into electrical signals representative of the intensity of the infrared energy signals, a multiplexer for multiplexing the focal plane detector array electrical output to a dynamic preamplifier for amplification to a working level and a data processing means including a dynamic amplifier connected to the preamplifier for removing correlated noise from the information signal prior to signal processing, the dynamic amplifier including a plurality of switched capacitors and a transistor controlled by a controller whereby the incoming signals are stored in selected capacitors, amplified and combined to produce a difference signal at the output substantially equal to the focal plane detector array output.

6 Claims, 20 Drawing Figures

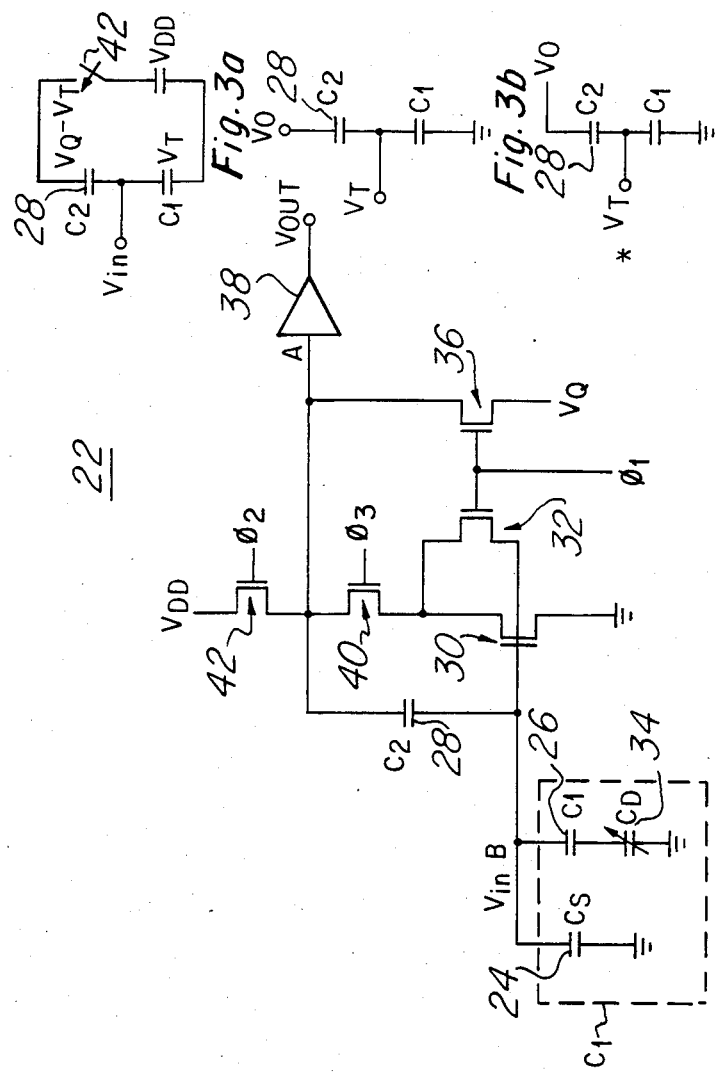

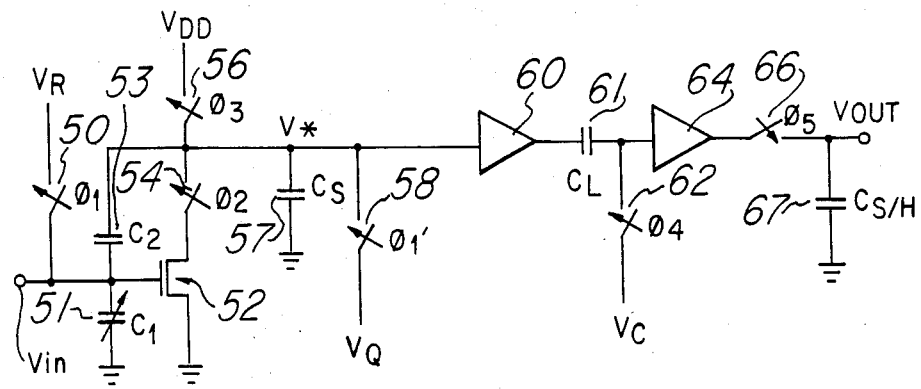
Fig. 4
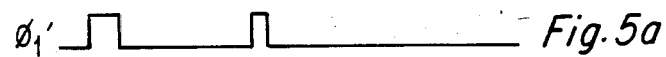
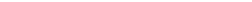
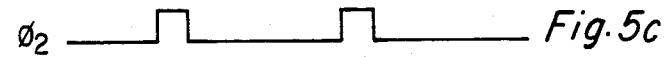

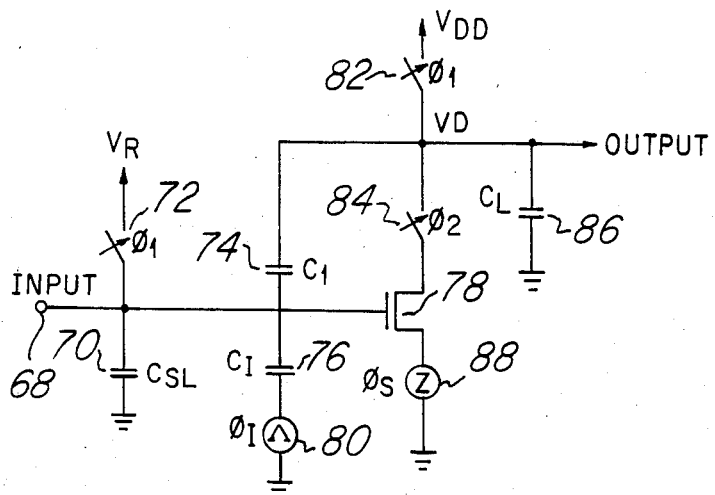
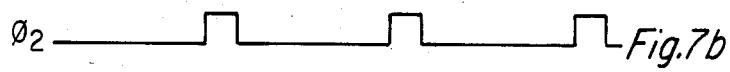
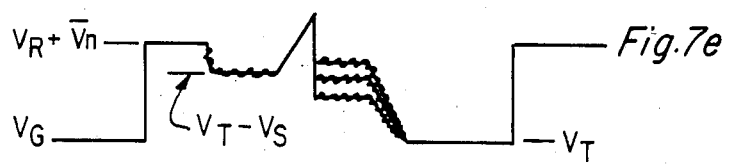
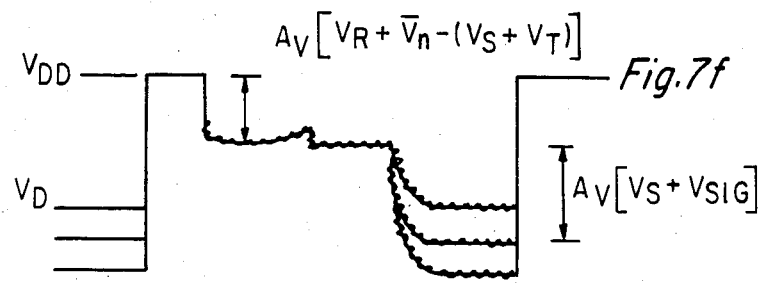
Fig. 7

FOCAL PLANE ARRAY INFRARED DEVICE

This invention relates to infrared detection devices and more particularly to an infrared system having a focal plane detector array.

In the past, infrared systems having a focal plane array of, for example, charge injection devices or metal insulated semiconductors have utilized standard non-dynamic amplifiers to sense the signal charge in the charge injection devices constituting the focal plane array of detectors. A problem attending the use of amplifiers is performance degradation; degradation is the result of 1/f noise and random noise generated by the amplifiers. A further problem with the prior art systems is that they sense the charge collected in the potential well. Yet another problem is the effect of the heat generated by the signal processing circuit elements mounted upon the cooling element on the cooling system.

The feasibility of replacing the static operational amplifiers in switched-capacitor MOS circuits by a simple group of switches that acts as a dynamic amplifier in a switched-capacitor integrator and in a low resistive feedback circuit, where dc gain rather than integrator action is required, is described by M. A. Copeland and J. M. Rabaey in "Electronic Letters", 15, No. 10, May 10, 1979, pp 301-302. As pointed out in the letters, the advantages of the dynamic-amplifier circuit over switched capacitor circuits using a static operational amplifier are that it saves the static power of the operational amplifier, as well as much of the chip area required for the operational amplifier. Also, no 1/f noise will be present because the channel of the discharging transistor is going empty at the end of the discharge (1/f noise is proportional to drain current). Thus, good noise performance can be expected.

A problem with the previous low noise amplifier concept is associated with the power dissipation required. Power dissipation on infrared focal plane processors has to be tightly budgeted because of cooling (77 degrees Kelvin) requirements.

Accordingly, it is an object of this invention to provide an infrared energy detector system utilizing a charge injection device type or metal insulated semiconductor type focal plane detector array with improved performance characteristics.

Another object of the invention is to provide an infrared energy detector system utilizing a charge injection device type focal plane detector array with an improved read out circuit.

A further object of the invention is to provide a dynamic amplifier having increased sensitivity for sensing small changes in large capacitors, or in sensing small charge variations on large capacitors.

Still another object of the invention is to eliminate the requirement in focal plane arrays for large value capacitance in the source circuit.

Yet another object of the invention is to provide a dynamic amplifier circuit means for mounting on the cooling means with the focal plane detector array having minimum heat dissipation requirements.

Briefly stated, the invention has three embodiments. The first embodiment is an infrared energy detection system having a charge injection device type detector system with a modified dynamic (switched capacitor) amplifier read out circuit. As the amplifier is dynamic, no 1/f noise is present because the channel of the discharging transistor is going to empty at the end of the discharge. Further, as the gain scales with the total input capacity, the circuit, whether operated as a charge sensing or capacitance sensing amplifier, can be used with large arrays and still provide the capability of being background limited.

The second embodiment adds to the first embodiment a correlated double sampler to cancel any output noise owing to the reset of the input signals.

Other objects and features of the invention will become more readily apparent from the following detailed description when read in conjunction with the following drawings in which:

FIG. 2 is a schematic diagram of the charge injection device focal plane array readout circuit:

FIGS. 3a-3c are partial schematics of the charge injection device readout circuit used in the description of the operation of the circuit;

FIG. 4 is a schematic diagram of a second embodiment of the invention;

FIGS. 5a-5f are timing diagrams for the invention of the first and second embodiments;

FIG. 6 is a schematic of a third embodiment of the invention;

FIGS. 7a-7f are timing diagrams for the invention of the third embodiment; and

Figure 1:
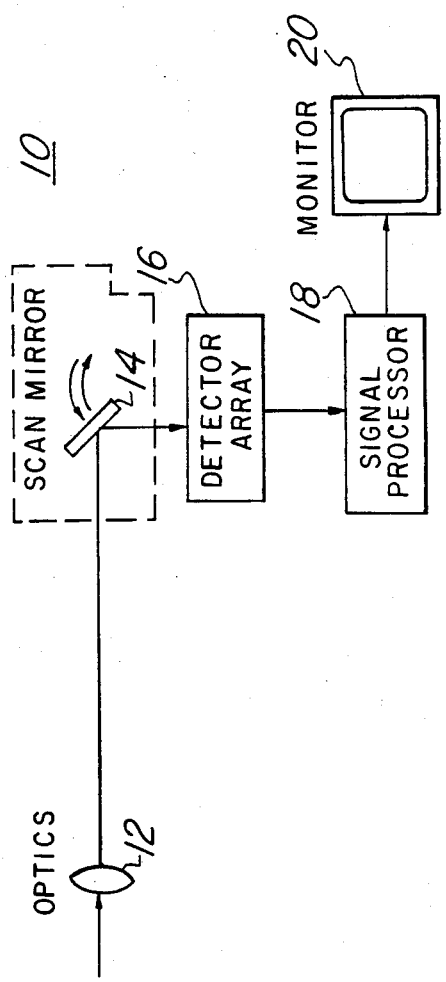
FIG. 1 is a block diagram of a focal plane array infrared energy detector imager.

Referring now to FIG. 1, the infrared imager 10 includes an optical system 12 for focusing infrared energy emanating from a scene. A scanning mirror 14, if needed, scans the incoming infrared energy across a focal plane detector array 16. Those persons skilled in the art will appreciate that a scanning mirror is not required for staring systems. The detector array 16 produces electrical signals representative of the infrared energy impinging thereon. A signal processor 18 processes the electrical signal output of the detector array into information signals such as, for example, TV video signals for display on monitor 20. The detector array 16 is, for example, an array of charge injection devices. The signal processor includes a preamplifier for amplification of the signals to working levels.

Referring now to FIG. 2, the signal processor 18 includes a dynamic (switched capacitor) amplifier 22. The dynamic amplifier has a $V_{in}$ terminal for connection to the multiplexer output of the charge injector device focal plane array 16. $C_1$ represents a circuit model of the read line of a CID. $C_i$ is the CID read well insulator capacitance. $C_D$ is the depletion capacitance of the well and $C_s$ is the stray capacitance loading the device location being read. Capacitor 28 is connected to the junction of FET switches 40 and 42 and to the junction of the drain of FET switch 36 and of amplifier 38. FET 30 has its drain connected to the junction of the drain of FET switch 32 and to FET switch 40. The source of FET 30 is connected to ground. The source of FET switch 40 is connected to the drain of FET switch 42. The gates of FET switch 32 and FET switch 36 are connected to a generator that produces the phase one clocking outputs and the gates of FET switches 40 and 42 are connected to the phase 3 and phase 2 clocking inputs. The sources of FET switches 42 and 36 are connected, respectively to $V_{DD}$ to $V_Q$.

For purposes of describing the circuit operation, an equivalent capacitance $C_1$ is computed from an equation as follows:

$$C_1 = [C_iC_D/(C_i+C_D)] + C_S$$

The circuit gives a voltage output signal that is proportional to the change of capacitance in a charge injection device. Operation is as follows.

When the phase 1 signal (FIG. 5b) is present FET switch 32 and FET switch 36 (FIG. 2) turn on to preset, respectively, the node A to $V_Q$ and the node B to the threshold of FET 30. Phase 2 (FIG. 5c) is non overlapping with phase 1 and turns on FET switch 42 (FIG. 2) to inject the charge injection in the CID. This decreases the capacitance $C_D$ of capacitor 34. The equivalent circuit for $V_{in}$ is shown in FIG. 3a. $V_{in}$ is computed as follows:

$$V_{DD} = V_T - V_T + V_Q + Q/[(C_1C_2)/(C_1+C_2)]$$

$$Q = (V_{DD} - V_Q)[(C_1C_2)/(C_1+C_2)]$$

$$V_{in} = V_T + (Q/C_1) = V_T + [(V_{DD} - V_Q)(C_2/(C_1+C_2))]$$

where $\Delta Q$ is the charge supplied by $V_{DD}$ during phase 2.

Phase 3 (FIG. 5d) is nonoverlapping and the output voltage goes to a voltage that is equal to $V_Q + V_{signal}$. The "gain" term for the signal can be analyzed using the equivalent circuit of FIG. 3b as follows:

$$V_T = [C_2/(C_1+C_2)]V_O$$

$$V_O = [(C_1+C_2)/C_2]V_T$$

As $V_T$ is held at a constant at both preset and at the end of phase 3 the following is true.

$$dV_O/dC_1 = [1/C_2]V_T$$

$$V_O \approx [C_1/C_2]V_T$$

Therefore $$V_O = V_Q + [C_1/C_2]V_T$$

This is desirable because the magnitude of $C_1$ can be quite large but the output signal is a function only of $\Delta C_1$. However, this system is appropriate only in large area arrays if the output node is heavily loaded with capacity, in which case the noise output reset can be ignored. The capacitor Co is chosen to be sufficiently large such that the capacitance at node A, $C_O + C_1C_2/C_1+C_2$, does not degrade the output signal to noise ratio. Noise generated by the reset of $C_1$ cannot be ignored and can be calculated as follows.

$$\delta V = (KT/C_1)^{\frac{1}{2}}$$

$$V_O = [(C_1+C_2)/C_1]V_T$$

$$V_O' = [(C_1+C_2)/C_1']V_T'$$

where $V_T' = V_T + \delta V$ and $C_1' = C_1 + \delta C$

The output now can be considered as being $$V_O - V_O' = 1/C_2[\delta CV_T + C_1\delta V + C_2\delta V + \delta V\delta C]$$

$$V_O - V_O' = (\delta C/C_2)V_T + \delta C\delta V/C_2 + \delta V[(C_1 + C_2)/C_2]$$
[gain signal] [gain noise] [big noise term]

Referring now to FIG. 4, where it is desirable to cancel the output noise owing to the reset of the input, a correlated double sampler is used with the nondynamic amplifier which includes: a phase 1 switch 50 connected to the junction $C_1$, the same as previously defined, capacitor 51 and C2 capacitor 53 and gate of FET 52. Capacitor 51 is connected to ground. Capacitor 53 is connected to the junction of phase 2 and phase 3 switches 54 and 56, $C_S$ capacitor 57, phase 1' switch 58 and amplifier 60. A $C_L$ capacitor 61 has a first plate connected to the amplifier 60 and a second plate connected to the junction of a phase 4 switch 62 and an amplifier 64. A phase 5 switch 66 is connected to the amplifier 64. Phase switch 66 is connected to the junction of a S/H capacitor 67 and an output terminal. The phase 1, 3, 1' and 4 are connected, respectively, to $V_R$, $V_D$, $V_Q$ and $V_C$. Capacitors 57 and 67 are grounded. FET 52 has its source grounded and its drain connected to switch 54 The switches 50, 54, 56, 58, 62 and 66 are, for example, FETs. In this circuit, the reset of $C_1$ is shown more directly than in FIG. 2; however, either circuit behaves in a like manner.

In operation $V_R$ is chosen such that $V_R > VT + (KT/C1)^{\frac{1}{2}}$ and $V_Q$ is chosen such that the output quiescent point of V* is compatible with amplifier 60 and the drain of FET 52 remains greater than O V. throughout the read operation.

The phase 1' and phase 1 switches 58 and 50 set the input and output in response to phase 1 and phase 1' clock pulses (FIGS. 5a and 5b). This removes any signal from the system that is left over from the previous read cycle. It also initiates $(KT/C_1)^{\frac{1}{2}}$ noise on the input. The phase 2 switch 54 (FIGS. 5c & 4) settles the output to $$V^* = [(C_1+C_2)/C_2)](KT/C_1)^{\frac{1}{2}}$$

by the amplifying action previously described. The phase 4 (FIG. 5e) switch 62 is activated to store this voltage on $C_L$ and phase 1' (FIG. 5a) reactivates to restore the $(KT/C)^{\frac{1}{2}}$ noise on the input. The phase 3 (FIG. 5d) switch 56 (FIG. 4) is activated to inject the CID and the phase 2 (FIG. 5c) switch is reactivated to give $$V_* = (\delta C/C_2)V_T + (\delta C\delta V/C_2) + \delta V[(C_1+C_2)/C_2]$$

where $\delta_V = (KT/C_1)^{\frac{1}{2}}$. When this signal passes through $C_L$ the noise term $$\delta V[(C_1+C_2)/C_2]$$

is subtracted to give a sampled output, phase 5 (FIG. 5f) when switch 66 is activated to give $$\phi_5 = (\delta_C/C_2)V_T + (\delta_C\delta V)C_2$$
[signal] [noise]

$\delta_C/C_2$ is small hence the output is no longer dominated by the big noise term:

$$(KT/C_1)^{\frac{1}{2}}[(C_1+C_2)/C_2]$$

Sensing CID signals in a voltage mode can also be accomplished using a similar circuit (FIG. 6). By using the FIG. 6 circuit the requirement for very large capacitances (about 100 pf) for sufficient noise performance is avoided; this alleviates the integration problem attending the use of large capacitances in the signal processing.

The circuit includes a CID input terminal 68 connected to the junction of $C_{SL}$ capacitor 70 and phase 1 switch 72 and the junction of $C_1$ capacitor 74, $C_I$ capacitor 76 and gate of amplifier 78. Capacitor 70 is grounded and switch 72 is connected to $V_R$. Capacitor 76 is connected through the phase I generator 80 to ground. Capacitor 74 is connected to the junction of phase 1 and phase 2 switches 82 and 84 and to the junction of the $C_L$ capacitor 86 and the output terminal. Amplifier 78 has its source connected through phase S source of power 88 to ground and its drain connected to phase 2 switch 84. Phase 1 switch 82 is connected to $V_{DD}$. Finally, the $C_L$ capacitor 86 is connected to ground. The switches 70, 72, 82 and 84 are, for example, MOS transistors.

Operation of the circuit is as follows: At time $T_1$ the phase 1 clock (FIG. 7a) closes the phase 1 switches 72 and 82 to admit $V_R$ and $V_{DD}$. Simultaneously, the phase S source supply 88 goes to a level $V_S$. The gate of transistor 78 is thereby precharged to $V_R$ and the output node $V_D$ is precharged to $V_{DD}$. This precharged operation results in an uncertainty on the gate voltage which must be removed; the uncertainty is given by $$\overline{V}_N = [KT/(C_{SL}+C_I+C_1)]^{\frac{1}{2}}$$

A similar effect at the output node gives $\overline{V}_N$ output which is assumed to be negligible as $C_L$ is large. $\overline{V}_N$ output is approximately equal to $$[KT/(C_1+C_L)]^{\frac{1}{2}}$$

At time $T_2$ the phase 2 clock (FIG. 7b) closes switch 84 connected to the drain of transistor 78. The output node discharges through transistor 78 and the decaying waveform is coupled to the gate. (It is assumed the $V_R > V_S + V_T + \overline{V}_N$) When $V_O = V_T + V_S$ the discharge stops. $V_D$ has decayed to $$V_{DD} - A_V[V_R + \overline{V}_N - (V_S + V_T)]$$

where $A_V$ is the voltage gain of the circuit given by $$1+(C_{SL}+C_I)/C_1,$$

At this point the circuit has been calibrated to the threshold voltage $V_T$. From now until the next precharge cycle the capacitor voltages are not disturbed except by the introduction of the signal.

At time $T_3$ the injection pulse generator 80 injects an injection pulse (FIG. 7c) through the $C_I$ capacitor 76 to operate the CID. As transistor 78 is disconnected via the phase 2 switch 84, this high level waveform is not amplified and applied to later processing stages; thus, the large signal transient response requirements of present focal plane amplifiers is avoided. Following the injection pulse waveform, the signal voltage is assumed to be present on the input node.

At time $T_4$ the source supply 88 is taken to ground by the phase S clock (FIG. 7d) and the gate to source voltage of transistor 78 is now $$V_T + V_S + V_{sig}$$

Thus, $V_S$ must be larger than the largest peak negative signal voltage of proper operation.

At time $T_5$ the phase 2 switch 84 is closed again by the phase 2 clock (FIG. 7b). The output node now discharges from $$V_D' = V_{DD} - A_V[V_R + \overline{V}_N - (V_S + V_T)]$$

to $$V_D'' = V_D' - A_V(V_S + V_{sig}) \text{ (FIG. 7f)}$$

$V_D'' - V_D/\overline{V}_N$ is independent of both $V_T$ and $\overline{V}_N$. This operation can be achieved using correlated double sampling (CDS). To prevent the KTC noise generated by steps 2 and 5 from appearing on the output node, $C_L$ is made large, i.e.

$$C_L > C_{SL}$$

Figure 8:
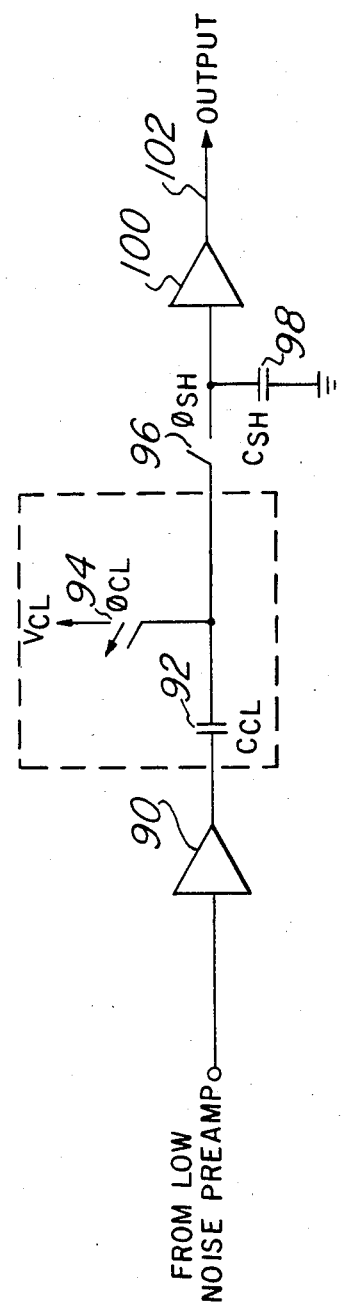
FIG. 8 is a schematic diagram of the correlated double sampling for the third embodiment.

The correlated double sample circuit (FIG. 8) is connected between the preamplifier and non-dynamic range amplifier and includes a buffer amplifier connected to the output terminal of the low noise preamplifier. A capacitor 92 is connected to the buffer amplifier 90. The capacitor 92 is connected to the junction of a pair of switches 94 and 96. Switch 94 is connected to $V_{CL}$ and switch 96 is connected to the junction of $C_{SH}$ capacitor and buffer amplifier 100. Buffer amplifier 100 is connected to an output terminal 102.

In operation the $\emptyset_{CL}$ switch 94 is closed prior to $T_3$ (FIG. 7c) and stores a level proportional to $V_D'$ on $C_{CL}$ capacitor 92. The $\emptyset_{SH}$ switch 96 is closed prior to the next precharge (phase 1) and results in a value proportional to $V_D'' - V_D'$ stored on the $C_{SH}$ capacitor 98. The buffer amplifier 90 need only be a source follower if sufficient gain is obtainable from the low noise preamplifier stage. Buffer amplifier 100 is a source follower to drive other circuitry. The values of $C_{CL}$ and $C_{SH}$ must be sufficiently large to make the KTC noise introduced at clamp and sample operation negligible. Although a separate CDS circuit is required, the operation of the preamplifier is formatted to take advantage of sampled data techniques. First, for a fixed signal charge packet from the detector, the gain is independent of the sense line capacitance $C_{SL}$, i.e., if $$V_{sig} = Q_{sig}/(C_{SL}+C_I+C_1),$$

then $$V_{out} = Q_{sig}/C_1.$$

This is important in large starting arrays where $C_{SL}$ is large.

Further, the high frequency components of 1/f noise is attenuated. Also the drain current of transistor 78 is substantially zero during an appreciable portion of the operating cycle; thus, one can expect, that the surface states characterized by time constants smaller than the operating cycle time should empty, and therefor not contribute to noise. Finally this low duty cycle leads to lower chip power dissipation. The power requirements for present multi-channel processors is a severe limitation on their size.

Although several embodiments of this invention have been described, it will be apparent to a person skilled in the art that various modifications to the details of construction shown and described may be made without departing from the scope of this invention.

What is claimed is:

1. A focal plane array infrared device comprising:
   (a) optical means for receiving and focusing infrared energy emanating from a scene;
   (b) a focal plane detector array for receiving the focused infrared energy and producing electrical signals representative of the infrared energy impinging thereon;
   (c) a multiplexer for multiplexing the focal plane detector array electrical signal output;
   (d) a preamplifier connected to the multiplexer for amplifying the electrical signals to a working level; and
   (e) a data processing means for processing the data representative of the infrared image of the scene, said data processing means including
   (f) a dynamic amplifier circuit means for reducing substantially the 1/f time correlated noise during read out of the focal plane detector array which amplifier includes a solid state transistor amplifier, a plurality of capacitors selectively connected together and to the transistor amplifier and a plurality of solid state switches operatively connected to the plurality of capacitors for selectively controlling the operation of the capacitors for substantially obtaining background noise performance from the electrical signals representative of the detected infrared signals, the plurality of switched capacitors further including a control means operatively connected to the plurality of solid state switches for selectively controlling their operation to reduce the amount of heat generated resulting in increased detector cooling efficiency.

2. A focal plane array infrared device comprising:
   (a) optical means for receiving and focusing infrared energy emanating from a scene;
   (b) a focal plane detector array for receiving the focused infrared energy and producing electrical signals representative of the infrared energy impinging thereon;
   (c) a multiplexer for multiplexing the focal plane detector array electrical signal output;
   (d) a preamplifier connected to the multiplexer for amplifying the electrical signals to a working level; and
   (e) data processing means for processing the data representative of the infrared image of the scene, said data processing means including
   (f) a dynamic amplifier circuit means for reducing substantially the 1/f time correlated noise during read out of the focal plane detector array; such that the dynamic amplifier circuit means includes a control means, an input terminal connected to the output of the focal plane detector array preamplifier, first and second capacitor means and a transistor operatively connected to the input terminal, an amplifier operatively connected to the second capacitor means, and first, second, third and fourth solid state switches operatively connected through phase 1, 2 and 3 leads to the control means, the first and second solid state switches connected, respectively, to the phase 2 and 3 leads and in cascade to $V_{DD}$ and to the junction of the transistor and third solid state switch, the junction of the first and second solid state switches being connected to the second capacitor means and to the amplifier, and the fourth solid state switch being connected to $V_Q$, the junction of the third solid state switch and the phase 1 lead of the control means and to the amplifier to activate the third and fourth solid state switches by phase 1 of the control means to turn on the third and fourth solid state switches for setting the amplifier input to a preselected voltage $V_Q$ and the input voltage to the threshold voltage of the transistor, the switch being turned on by phase 2 of the control to inject the output of the preamplifiers into the first capacitor means, and the second solid state switch being turned on by phase 3 of the control to provide a difference voltage output equal to the CID charge to the amplifier.

3. A focal plane array infrared device according to claim 2 wherein the first capacitor means includes the capacitances of the focal plane array readline, read well insulator, the depletion capacitance of the wells and the stray capacitance loading the device location being read, such that when phase 2 of the control means turns on the first solid state switch, the capacitance is decreased by an amount substantially equal to the incoming charge output of the preamplifier.

4. A focal plane array infrared device according to claim 10 wherein the second capacitor means is a capacitor operatively connected to the first capacitor means so that, when the first solid state switch is turned on, the capacitance of the first capacitor decreases and when the second solid state switch is turned on the combined output of the first and second capacitor means is a function only of the difference in capacitance.

5. A focal plane array infrared device comprising:
   (a) optical means for receiving and focusing infrared energy emanating from a scene;
   (b) a focal plane detector array for receiving the focused infrared energy and producing electrical signals representative of the infrared energy impinging thereon;
   (c) a multiplexer for multiplexing the focal plane detector array electrical signal output;
   (d) a preamplifier connected to the multiplexer for amplifying the electrical signals to a working level; and
   (e) a data processing means for processing the data representative of the infrared image of the scene, said data processing means including
   (f) a dynamic amplifier circuit means for reducing substantially the 1/f time correlated noise during read out of the focal plane detector array; so that the dynamic amplifier circuit means comprises a first capacitor, a load capacitor and a sample and hold capacitor, a transistor, first and second amplifiers, a plurality of solid state switches, and a controller for generating phases 1', 1, 2, 3, 4 and 5 control signals, said phase 1 solid state switch connected to a preselected voltage $V_R$ and to the junction of the first capacitor, focal plane array output capacitance, capacitor and transistor, the capacitor connected to the junction of solid state phase 2 and phase 3 switches, source capacitor, phase 1' solid state switch and first amplifier, the transistor has its drain connected to the phase 2 solid state switch and its source connected to ground, the phase 3 solid state switch is connected to $V_{DD}$, the phase 1' solid state switch is connected to preselected voltage $V_Q$, the phase 4 solid state switch is connected to the junction of the load capacitor and the second amplifier, and the phase 5 solid state switch is connected to the second amplifier and to the junction of the sample and hold capacitor and output, and said controller is connected to the solid state switches for selectively actuating the phase 1 and phase 1' switches for removing any left over signal from the system and resetting the input and output threshold voltages, the phase 2 switch for settling the output voltage to the combined capacitance value plus the reset noise, the phase 4 switch for storing the output voltage on the load capacitor, the phase 1' switch again for restoring the reset noise on the input, the phase 3 switch for injecting the amplified CID output signal, the phase 2 switch again to pass the reduced capacitance and noise through the load capacitor to produce a difference signal, and the phase 5 switch for storing the difference signal on the sample and hold capacitor.

6. A focal plane array infrared device comprising:
(a) optical means for receiving and focusing infrared energy emanating from a scene;
(b) a focal plane detector array for receiving the focused infrared energy and producing electrical signals representative of the infrared energy impinging thereon;
(c) a multiplexer for multiplexing the focal plane detector array electrical signal output;
(d) a preamplifier connected to the multiplexer for amplifying the electrical signals to a working level; and
(e) a data processing means for processing the data representative of the infrared image of the scene, said data processing means including
(f) a dynamic amplifier circuit means for reducing substantially the 1/f time correlated noise during read out of the focal plane detector array; wherein the dynamic amplifier circuit means includes an input and an output terminal, a source load capacitor, a capacitor, an inject capacitor, a pulse producing means, a transistor, a source supply means, a load capacitor, a plurality of solid state switches and a controller for producing phase 1, 2, I injection and S source supply control signals, the input terminal being connected to the junction of the source load capacitor and a first switch, to the junction of the inject capacitor and the capacitor and to the transistor, the first switch being connected to a preselected reverse voltage $V_R$, the source load capacitor being connected to ground, the injection capacitor being connected through the pulse producing source to ground, the capacitor being connected to the junction second and third switches and to the junction of the load capacitor and output terminal, the second switch being connected to the transistor, the source supply means being connected to the transistor and the controller being connected to the plurality of switches, to the pulse producing means and to the source supply means the first and second switches being turned on by phase 1 signals to precharge the gate of the transistor to the reverse voltage level together with a noise voltage, and to precharge the output to the drain voltage while simultaneously therewith the source supply goes to a level $V_S$, then the third switch is turned on by phase 2 signals and the output discharges through the transistor and the decaying waveform coupled to the gate and the circuit has been calibrated, then the pulse producer means is activated by phase I to charge the injection capacitor for the CID input, then the source supply means is grounded by phase S and the gate to source voltage is now the calibration voltage plus the source supply voltage and the CID voltage, then the third switch is turned on again and the output voltage discharges to a voltage independent of the threshold voltage and the noise voltage.

* * * * *